(12) United States Patent
Xu

(10) Patent No.: US 12,062,642 B2
(45) Date of Patent: Aug. 13, 2024

(54) MASS TRANSFER DEVICE, MANUFACTURING METHOD THEREOF AND DISPLAY APPARATUS

(71) Applicant: CHONGQING KONKA PHOTOELECTRIC TECHNOLOGY RESEARCH INSTITUTE CO., LTD., Chongqing (CN)

(72) Inventor: Shi Yuan Xu, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 599 days.

(21) Appl. No.: 17/241,712

(22) Filed: Apr. 27, 2021

(65) Prior Publication Data

US 2021/0249388 A1    Aug. 12, 2021

Related U.S. Application Data

(63) Continuation of application No. PCT/CN2019/130529, filed on Dec. 31, 2019.

(51) Int. Cl.
| | | |
|---|---|---|
| *H01L 25/075* | (2006.01) | |
| *H01L 33/00* | (2010.01) | |
| *H01L 33/48* | (2010.01) | |

(52) U.S. Cl.
CPC ...... *H01L 25/0753* (2013.01); *H01L 33/0095* (2013.01); *H01L 33/483* (2013.01)

(58) Field of Classification Search
CPC .. H01L 21/68; H01L 25/0753; H01L 33/0095
See application file for complete search history.

(56) References Cited

U.S. PATENT DOCUMENTS

| 2015/0076528 | A1  | 3/2015 | Chan et al. | |
|---|---|---|---|---|
| 2019/0109262 | A1* | 4/2019 | Danesh | H01L 33/42 |
| 2019/0189496 | A1* | 6/2019 | Chen | B65G 47/90 |

FOREIGN PATENT DOCUMENTS

| CN | 107978548 A | 5/2018 |
|---|---|---|
| CN | 109148352 A | 1/2019 |

(Continued)

OTHER PUBLICATIONS

International Search Report issued in corresponding International Application No. PCT/CN2019/130529, mailed Sep. 25, 2020, pp. 1-9, Beijing, China.

(Continued)

*Primary Examiner* — Daniel P Shook
(74) *Attorney, Agent, or Firm* — HAUPTMAN HAM, LLP

(57) ABSTRACT

The disclosure provides a manufacturing method of a mass transfer device. The manufacturing method includes the following. A transfer substrate coated with an adhesive layer is provided. A light emitting diode is transferred from an original substrate to the transfer substrate. A supporting structure is etched on the light emitting diode, where the supporting structure includes at least two supporting columns extending from the transfer substrate, and ends of the at least two supporting columns away from the transfer substrate are connected with the light emitting diode, so that the light emitting diode is arranged separately from the transfer substrate. The adhesive layer is removed, so that the light emitting diode is fixed on the transfer substrate only through the supporting structure. In addition, the disclosure also provides a mass transfer device and display equipment.

12 Claims, 8 Drawing Sheets

(56) References Cited

FOREIGN PATENT DOCUMENTS

| | | | | |
|---|---|---|---|---|
| CN | 109920815 A | * | 6/2019 | ............. H01L 27/15 |
| CN | 109920815 A | | 6/2019 | |
| CN | 110121770 A | | 8/2019 | |
| CN | 110610893 A | | 12/2019 | |

OTHER PUBLICATIONS

The first office action issued in corresponding CN application No. 2019800041337 dated Feb. 8, 2022.

* cited by examiner

MASS TRANSFER DEVICE, MANUFACTURING METHOD THEREOF AND DISPLAY APPARATUS

CROSS-REFERENCE TO RELATED APPLICATIONS

This application is a continuation of International Application No. PCT/CN2019/130529, filed on Dec. 31, 2019, the entire disclosures of which are incorporated herein by reference.

TECHNICAL FIELD

The disclosure relates to the technical field of micro light emitting diodes, in particular to a mass transfer device, a manufacturing method thereof and a display apparatus.

BACKGROUND

A micro light emitting diode (Micro-LED) as well as light emitting diode scaling and matrixing technologies presents advantages in stability, service life and operating temperature. The micro-LED also inherits advantages of low power consumption, high color saturation, fast response, strong contrast and the like of a light emitting diode. Meanwhile, the micro-LED provides higher brightness and lower power consumption, among others.

Therefore, the micro-LED has great application prospect in the future, such as in a micro-LED display screen. But at present, the biggest bottleneck in manufacturing the micro-LED display screen is to realize its mass production. The most effective way to realize the mass production is to implement a selective mass transfer. In a traditional selective mass transfer, the light emitting diode is usually fixed on a substrate with an adhesive material. In this fixing method, the light-emitting diode may displace in transferring, and the light emitting diode may be shifted after being transferred to a target substrate and cannot be accurately disposed on a set position. Thus, manufacturing efficiency of the micro-LED display screen is compromised.

SUMMARY

In this disclosure, a supporting structure is etched between a substrate and a light emitting diode, which greatly improves manufacturing efficiency of a micro-LED display screen.

In a first aspect, implementations of the present disclosure provide a mass transfer device, which includes a transfer substrate; at least one light emitting diode arranged on the transfer substrate at intervals; a supporting structure arranged on the transfer substrate and supporting the at least one light emitting diode, where the supporting structure includes at least two supporting columns extending from the transfer substrate, and an end of each of the at least two supporting columns away from the transfer substrate is connected with the light emitting diode; and the light emitting diode is separated from the transfer substrate.

In a second aspect, implementations of the present disclosure provide a manufacturing method of a mass transfer device, the method includes the following.

A transfer substrate coated with an adhesive layer is provided. At least one light emitting diode arranged on an original substrate at intervals is adhered with the adhesive layer to transfer the light emitting diode from the original substrate to the transfer substrate. A supporting structure is formed, where the supporting structure includes at least two supporting columns extending from the transfer substrate, and an end of each of the at least two supporting columns away from the transfer substrate is connected with the light emitting diode. The adhesive layer is removed, so that the light emitting diode is fixed, through the supporting structure, to the transfer substrate at a predetermined distance from the transfer substrate.

In a third aspect, implementations of the present disclosure provide a display apparatus, which includes a housing and a display backplate received in the housing. The display backplate is provided with a plurality of light emitting diodes which are transferred by the mass transfer device described above to the display backplate. Only ends of the supporting structure are retained on the light emitting diode.

By means of the mass transfer device described above and the manufacturing method thereof, the supporting structure is etched on the light emitting diode by using a photolithographic process and a dry etching method, so that the light emitting diode is firmly fixed to the substrate. In a subsequent selective mass transfer process, the light emitting diode is not subjected to displacement or other problems, thus improving transfer accuracy.

DETAILED DESCRIPTION

Figure 1:
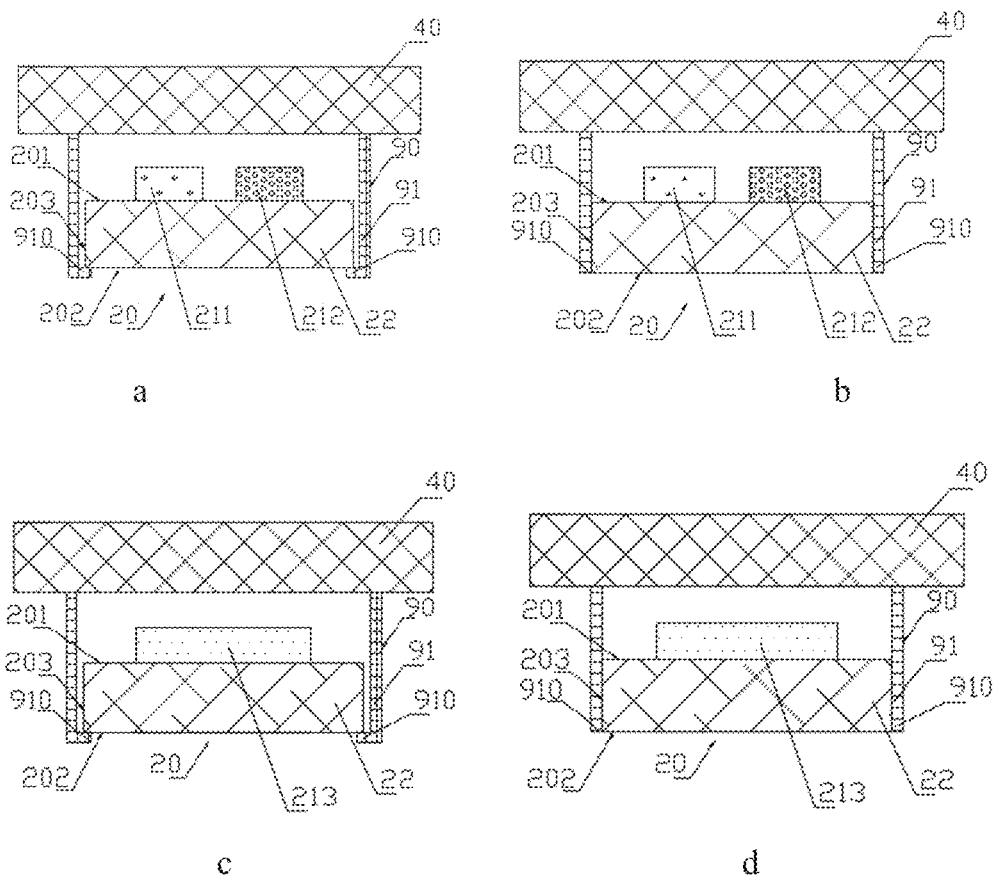
FIGS. 1a-1d are schematic diagrams of a mass transfer device provided in an implementation of the present disclosure.

In order to understand content of the present disclosure more clearly and precisely, detailed description will now be made with reference to attached drawings. The accompanying drawings illustrate examples of implementations of the present invention, in which like reference numerals refer to like elements throughout. It should be understood that the drawings are not to scale as an actual implementation of the disclosure, but are for illustrative purposes, and not drawn according to original dimensions.

Now reference is made to FIG. 1a, which is a schematic diagram of a mass transfer device 1000 according to implementations of the present disclosure. The mass transfer device 1000 includes a transfer substrate 40, light emitting diodes 20, and a supporting structure 90. Specifically, the light emitting diodes 20 are arranged on the transfer substrate 40 at intervals. Each of the light emitting diode 20 includes a first end face 201 facing the transfer substrate 40, a second end face 202 opposite to the first end face 201, and a side face 203 between the first end face 201 and the second end face 202. The light emitting diode 20 further includes a semiconductor functional layer 22, and a first electrode 211 and a second electrode 212 respectively coupled with the semiconductor functional layer 22. Both the first electrode 211 and the second electrode 212 are located on a side of the semiconductor functional layer 22 proximate to the transfer substrate 40; that is, the light emitting diode 20 is of a flip-chip structure (with its two electrodes being located on a same side of the semiconductor functional layer 22), and a side on which the two electrodes are arranged is proximate to the transfer substrate 40.

The supporting structure 90 is arranged on the transfer substrate 40 and supports the light emitting diode 20. The supporting structure 90 includes at least two supporting columns 91 extending from the transfer substrate 40, and an end 910 of each of the at least two supporting columns 91 away from the transfer substrate 40 is connected with the light emitting diode 20. Each of the at least two supporting column 91 is made from at least one of silicon, silicon dioxide, or aluminum nitride. Specifically, the end 910 of each of the at least two supporting columns 91 away from the transfer substrate 40 is fixed to the second end face 202 of the light emitting diode 20, so that the light emitting diode 20 is separated from the transfer substrate 40, with a gap between the side face 203 of the light emitting diode 20 and each of the at least two supporting columns 91.

Now reference is made to FIG. 1b, which is a schematic diagram of a mass transfer device 2000 according to other implementations of the present disclosure. The mass transfer device 2000 provided in FIG. 1b is different from the mass transfer device 1000 provided in FIG. 1a in that the end 910 of each of the at least two supporting columns 91 away from the transfer substrate 40 is fixed to the side face 203 of the light emitting diode 20. Other structures of the mass transfer device 2000 are basically the same as those of the mass transfer device 1000, which will not be repeated here.

Now reference is made to FIG. 1c, which is a schematic diagram of a mass transfer device 3000 according to other implementations of the present disclosure. The mass transfer device 3000 provided in the FIG. 1c is different from the mass transfer device 1000 provided in FIG. 1a in that the light emitting diode 20 includes the semiconductor functional layer 22 and a third electrode 213 coupled with the semiconductor functional layer 22. The third electrode 213 is arranged on a side of the semiconductor functional layer 22 proximate to the transfer substrate 40. Other structures of the mass transfer device 3000 are basically the same as those of the mass transfer device 1000, which will not be repeated here. It should be noted that, since the light emitting diode 20 is directly transferred from an original substrate to the transfer substrate 40, if the light emitting diode 20 is of a vertical chip structure (i.e., its electrodes are respectively located on both sides of the semiconductor functional layer 22), an electrode is formed only on one side of the light emitting diode 20 when the light emitting diode is initially formed on the original substrate, and an electrode on the other side is required to be formed after the light emitting diode is mounted on the driving backplate.

Now reference is made to FIG. 1d, which is a schematic diagram of a mass transfer device 4000 according to other implementations of the present disclosure. The mass transfer device 4000 provided in 1d is different from the mass transfer device 3000 provided in FIG. 1c in that the end 910 of each of the at least two supporting columns 91 away from the transfer substrate 40 is fixed to the side face 203 of the light emitting diode 20. Other structures of the mass transfer device 4000 are basically the same as those of the mass transfer device 3000, which will not be repeated here.

Figure 2:
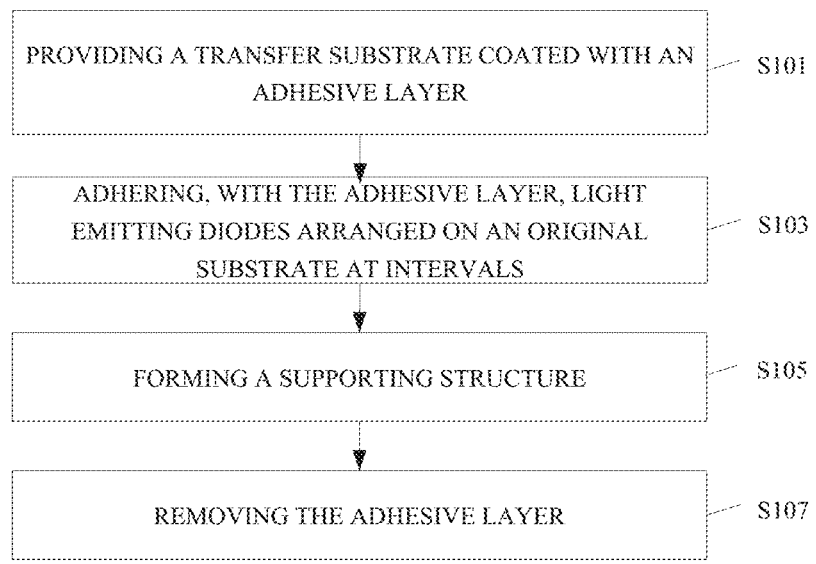
FIG. 2 is a flowchart of a manufacturing method of a mass transfer device provided in implementations of the present disclosure.
Figure 3:
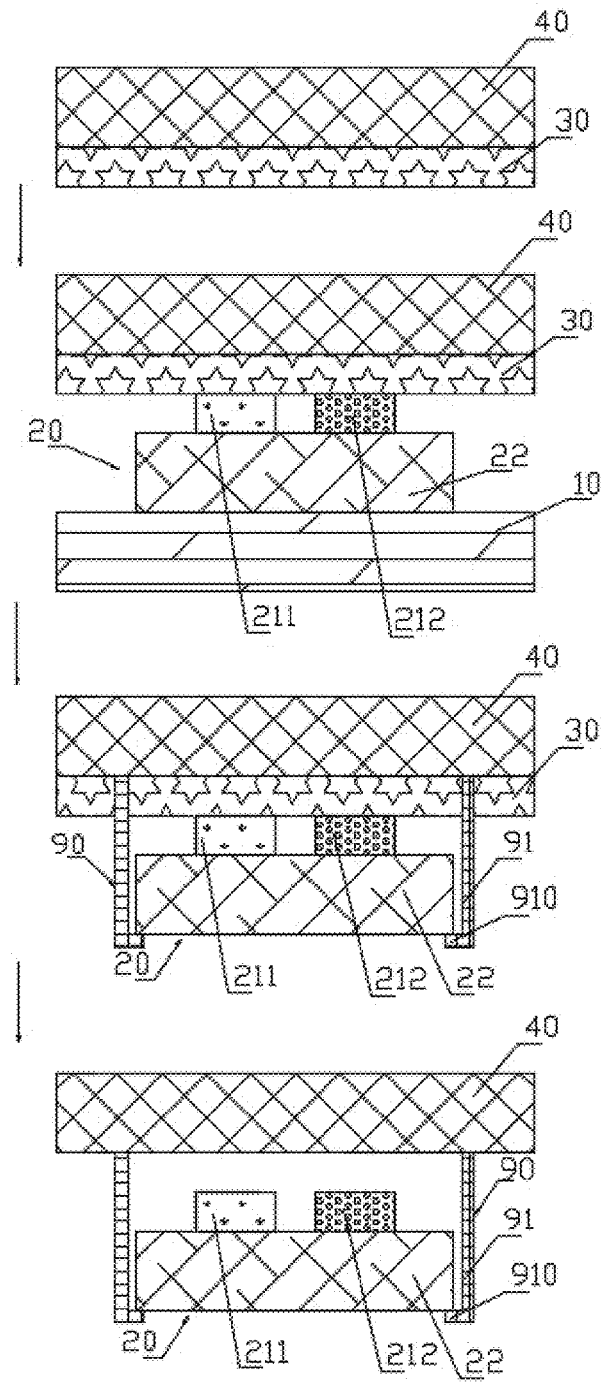
FIG. 3 is a schematic diagram showing processes of a manufacturing method of a mass transfer device according to other implementations of the present disclosure.

Now reference is made to both FIGS. 2 and 3, which are schematic diagrams of the manufacturing method of the mass transfer device according to implementations of the present invention. This manufacturing method of the mass transfer device is used for manufacturing the mass transfer device 1000, which includes following operations at S101 to S107.

At S101, a transfer substrate 40 coated with an adhesive layer 30 is provided. The adhesive layer 30 is a cold decomposition adhesive, with its viscosity increasing with increase in temperature;

At S103, light emitting diodes 20 arranged on the original substrate 10 at intervals are adhered with the adhesive layer 30 to transfer the light emitting diodes 20 from the original substrate 10 to the transfer substrate 40. The light emitting diode 20 includes the semiconductor functional layer 22, and the first electrode 211 and the second electrode 212 respectively coupled with the semiconductor functional layer 22. When the light emitting diode 20 is disposed on the original substrate 10, both the first electrode 211 and the second electrode 212 of the light emitting diode 20 are located on a side of the semiconductor functional layer 22 away from the original substrate 10. After the light emitting diode 20 is transferred to the transfer substrate 40, both the first electrode 211 and the second electrode 212 of the light emitting diode 20 are located on a side of the semiconductor functional layer 22 proximate to the transfer substrate 40.

At S105, a supporting structure 90 is formed. Specifically, the supporting structure 90 is etched on the light emitting diode 20 by using a photolithographic process and a dry etching method. The supporting structure 90 includes at least two supporting columns 91 extending from the transfer substrate 40, and the end 910 of each of the at least two supporting columns 91 away from the transfer substrate 40 is connected with the light emitting diode 20. Each of the light emitting diode 20 includes a first end face 201 facing the transfer substrate 40, a second end face 202 opposite to the first end face 201, and a side face 203 between the first end face 201 and the second end face 202. The end 910 of each of the at least two supporting columns 91 away from the transfer substrate 40 is fixed to the second end face 202 of the light emitting diode 20, so that the light emitting diode 20 is separated from the transfer substrate 40. There is a gap between the side face 203 of the light emitting diode 20 and each of the at least two supporting columns 91.

At S107, the adhesive layer 30 is removed. Specifically, the adhesive layer 30 is cooled to be released, so that the light emitting diode 20 is fixed, through the supporting structure 90, to the transfer substrate 40 at a predetermined distance from the transfer substrate 40, that is, a hollowed-out portion is formed between the light emitting diode 20 and the transfer substrate 40.

Figure 4:
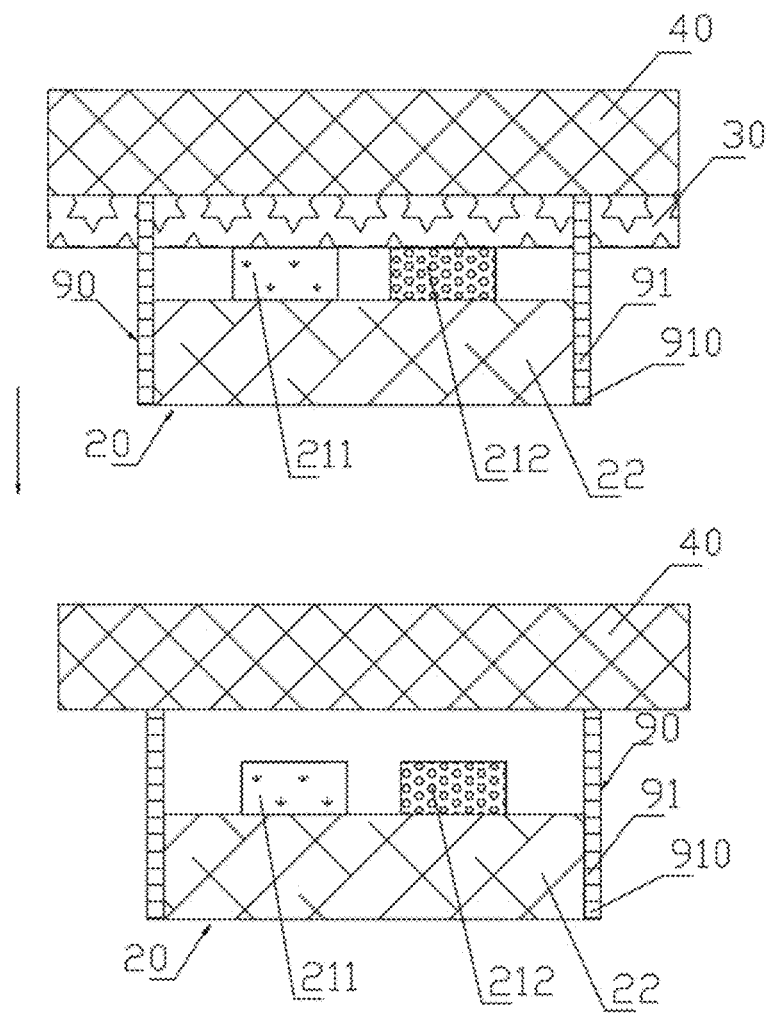
FIG. 4 is a schematic diagram showing sub-processes of a manufacturing method of a mass transfer device according to other implementations of the present disclosure.

Now reference is made to both FIGS. 2 and 4, which are schematic diagrams of the manufacturing method of the mass transfer device according to other implementations of the present invention. This manufacturing method of the mass transfer device is used for manufacturing the mass transfer device 2000. The manufacturing method of the mass transfer device provided in the FIG. 4 is different from the one provided in FIG. 3 in that the formed supporting structure 90 includes at least two supporting columns 91 extending from the transfer substrate 40, and the end 910 of each of the at least two supporting columns 91 away from the transfer substrate 40 is connected with the light emitting diode 20 in such a way that the end 910 of each of the at least two supporting columns 91 away from the transfer substrate 40 is fixed to the side face 203 of the light emitting diode 20. Other processes of the manufacturing method of the mass transfer device 2000 are basically the same as those of the mass transfer device 1000, which will not be repeated here.

Figure 5:
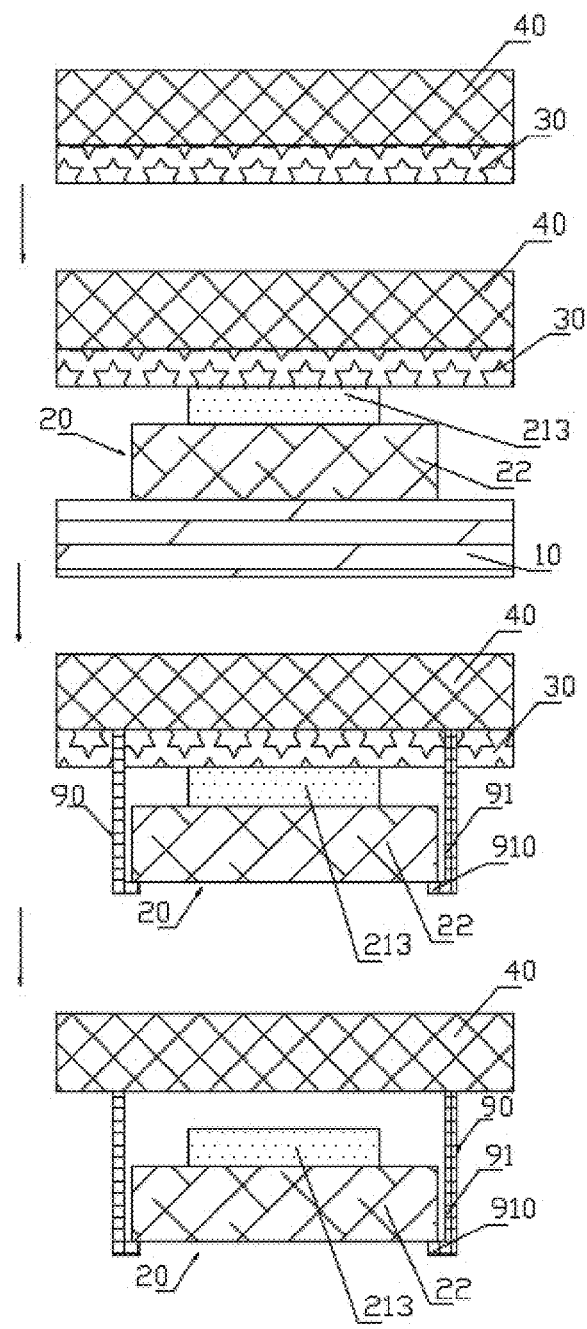
FIG. 5 is a schematic diagram showing processes of a manufacturing method of a mass transfer device according to other implementations of the present disclosure.

Now reference is made to both FIGS. 2 and 5, which are schematic diagrams of the manufacturing method of the mass transfer device according to the other implementations of the present invention. This manufacturing method of the mass transfer device is used for manufacturing the mass transfer device 3000. The manufacturing method of the mass transfer device provided in FIG. 5 is different from the manufacturing method of the mass transfer device provided in FIG. 3 in that the light emitting diode 20 includes the semiconductor functional layer 22 and a third electrode 213 coupled with the semiconductor functional layer 22. When the light emitting diode 20 is disposed on the original substrate 10, the third electrode 213 of the light emitting diode 20 is located on the side of the semiconductor functional layer 22 away from the original substrate 10. After the light emitting diode 20 is transferred to the transfer substrate 40, the third electrode 213 of the light emitting diode 20 is located on the side of the semiconductor functional layer 22 proximate to the transfer substrate 40. Other processes of the manufacturing method of the mass transfer device 3000 are basically the same as those of the mass transfer device 1000, which will not be repeated here.

Figure 6:
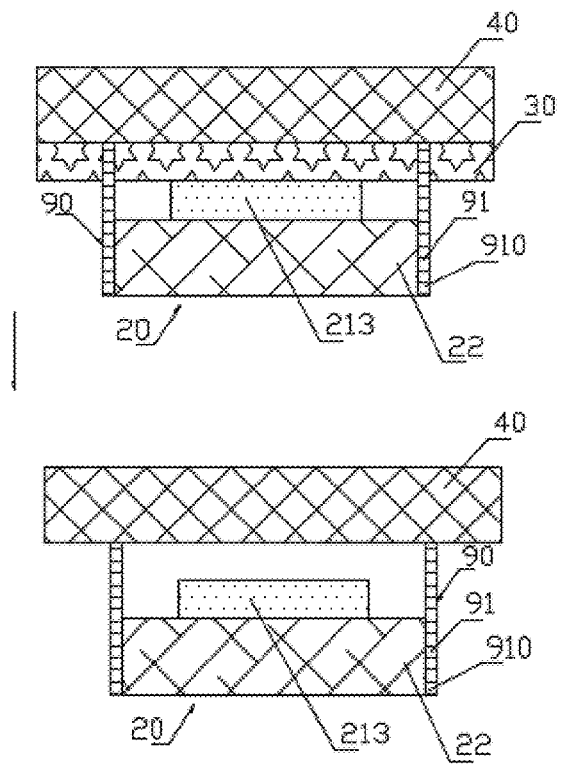
FIG. 6 is a schematic diagram showing sub-processes of a manufacturing method of a mass transfer device according to other implementations of the present disclosure.

Now reference is made to both FIGS. 2 and 6, which are schematic diagrams of the manufacturing method of the mass transfer device according to other implementations of the present invention. This manufacturing method of the mass transfer device is used for manufacturing the mass transfer device 4000. The manufacturing method of the mass transfer device provided in FIG. 6 is different from the one provided in the FIG. 5 in that the formed supporting structure 90 includes at least two supporting columns 91 extending from the transfer substrate 40, and the end 910 of each of the at least two supporting columns 91 away from the transfer substrate 40 is connected with the light emitting diode 20 in such a way that the end 910 of each of the at least two supporting columns 91 away from the transfer substrate 40 is fixed to the side face 203 of the light emitting diode 20. Other processes of the manufacturing method of the mass transfer device 4000 are basically the same as those of the mass transfer device 3000, which will not be repeated here.

Figure 7:
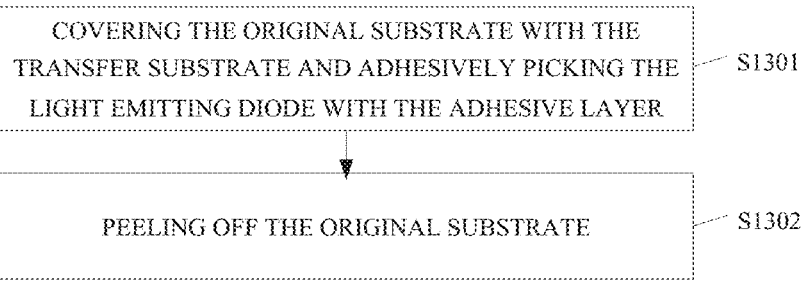
FIG. 7 is a sub-flowchart of the manufacturing method of the mass transfer device according to implementations of the present disclosure.
Figure 8:
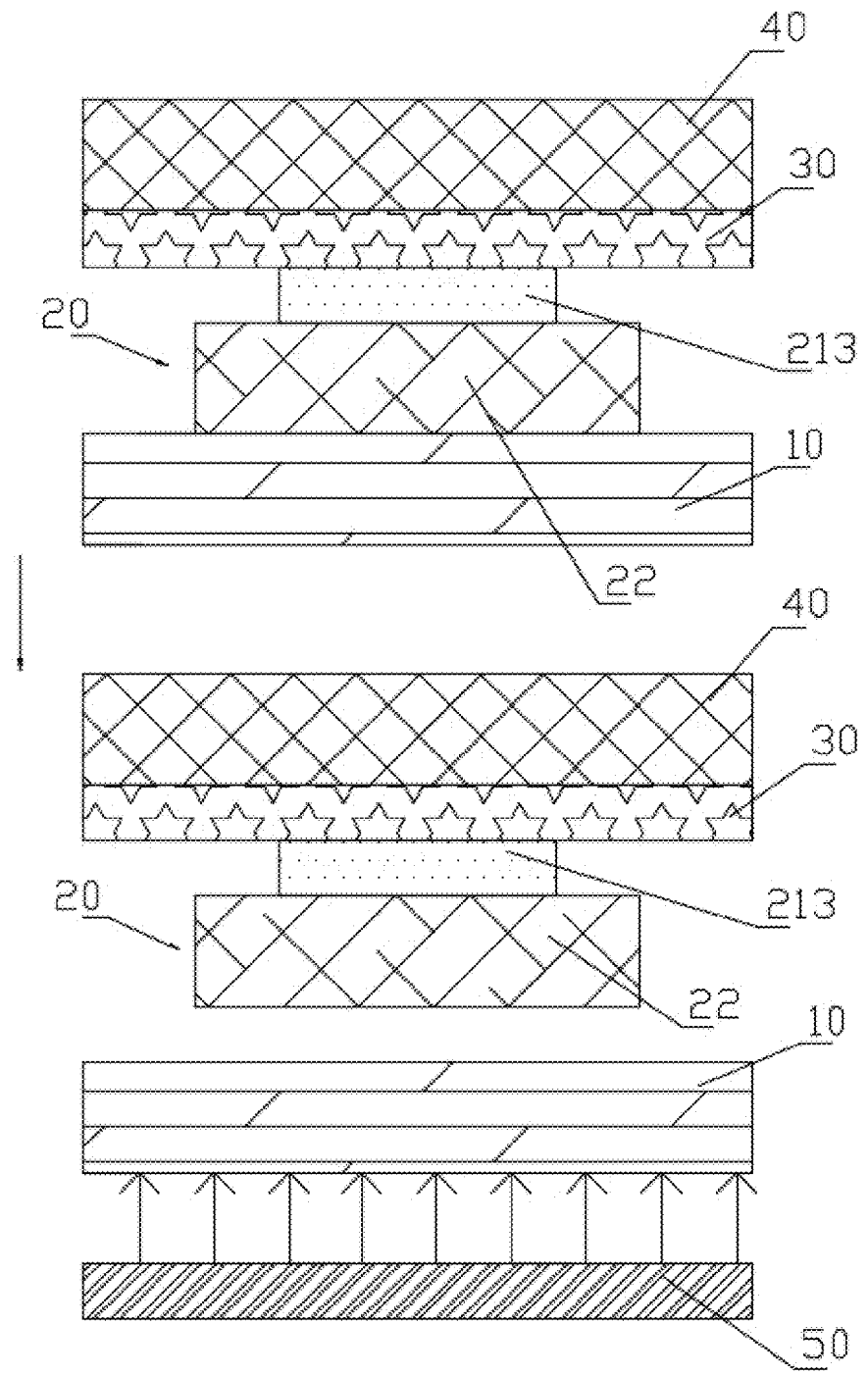
FIG. 8 is a schematic diagram showing sub-processes of the manufacturing method of the mass transfer device according to implementations of the present disclosure.

Now reference is made to both FIGS. 7 and 8, which are sub-flowcharts of the manufacturing method of the mass transfer device according to implementations of the present disclosure. Specifically, the process of adhering, with the adhesive layer 30, the light emitting diode 20 arranged on the original substrate 10 at intervals includes operations S1031 to S1032.

At S1031, the original substrate 10 is covered with the transfer substrate 40, and the light emitting diode 20 is adhesively picked with the adhesive layer 30. Specifically, a side of the adhesive layer 30 away from the transfer substrate 40 is disposed facing the light emitting diode 20, and is moved toward the light emitting diode 20 so as to affix the light emitting diode 20 to the adhesive layer 30. An electrode of the light emitting diode 20 disposed on the original substrate 10 is located on the side of the semiconductor functional layer 22 away from the original substrate 10. After the light emitting diode 20 is affixed to the adhesive layer 30, the electrode of the light emitting diode 20 is located on the side of the semiconductor functional layer 22 proximate to the transfer substrate 40, that is, the electrode of the light emitting diode 20 is adhered to the transfer substrate 40 with the adhesive layer 30.

At S1032, the original substrate 10 is peeled off. Specifically, the original substrate 10 is peeled off with a laser device 50. The laser device 50 is placed on a side of the original substrate 10 away from the light emitting diode 20, so that laser lights emitted by the laser device 50 irradiate the light emitting diode 20 through the original substrate 10, thereby peeling off the original substrate 10.

In the above implementation, the supporting structure 90 is etched on the light emitting diode 20 by using a photolithographic process and a dry etching method, so that the light emitting diode 20 is firmly fixed to the substrate 40. In a subsequent process of transferring the light emitting diode 40 to the display backplate, the supporting structure 90 is broken when the transfer device picks the light emitting diode 20. At the same time, due to the fixing of the supporting structure 90, the light emitting diode 20 will not be displaced when the transfer device picks the light emitting diode 20, which improves transfer accuracy and thus transfer efficiency.

Figure 9:
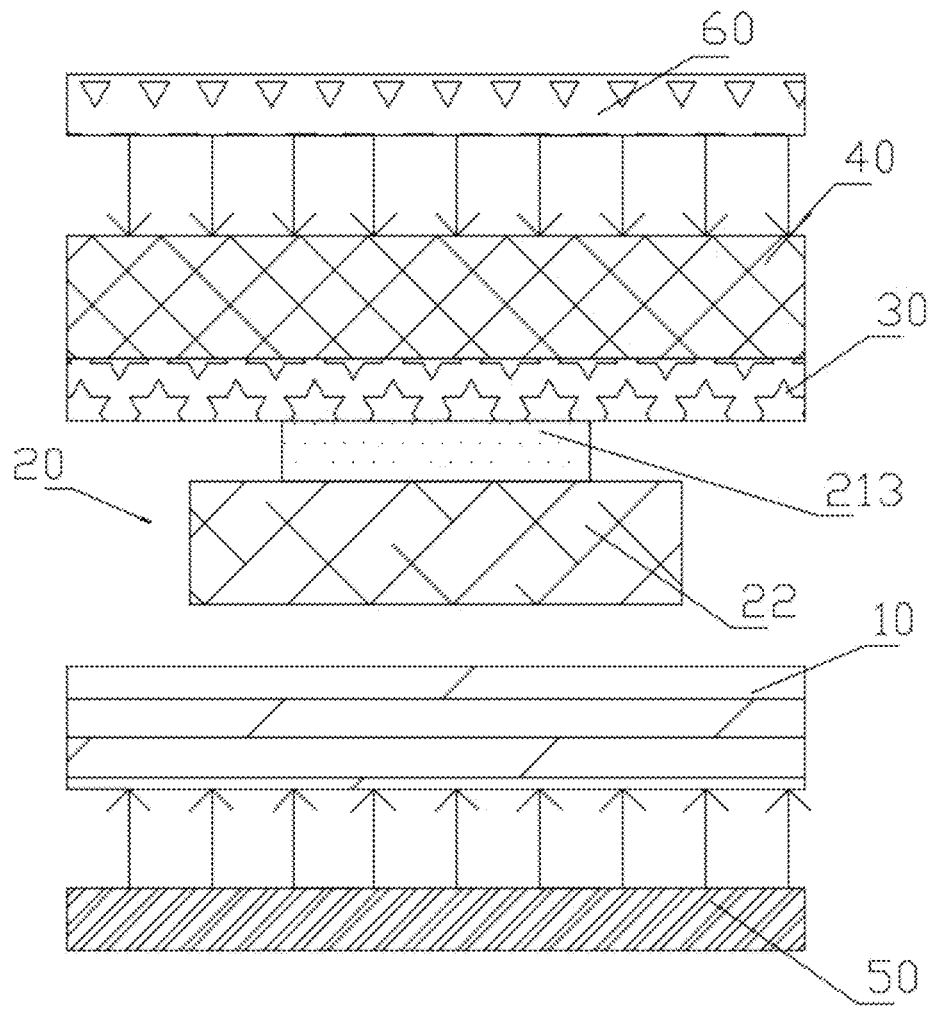
FIG. 9 is a schematic diagram showing sub-processes of a manufacturing method of a mass transfer device according to other implementations of the present disclosure.

Now reference is made to FIG. 9, which is a schematic diagram showing sub-processes of a manufacturing method of a mass transfer device according to other implementations of the present disclosure. The manufacturing method of the mass transfer device provided in FIG. 9 is different from the manufacturing method of the mass transfer device as illustrated in FIGS. 7 and 8 in that a heater 60 is provided to heat the adhesive layer 30 in a process of peeling off the original substrate 10. Specifically, the heater 60 is placed on the side of the transfer substrate 40 away from the adhesive layer 30. During the process of peeling off the original substrate 10, the adhesive layer 30 is heated by the heater 60 to increase temperature of the adhesive layer 30, thereby increasing the viscosity of the adhesive layer 30, so that the light emitting diode 20 will not be displaced during the process of peeling off the original substrate 10. Other processes of the manufacturing method of the mass transfer device provided as illustrated in FIG. 9 are basically the same as those of the manufacturing method of the mass transfer device provided as illustrated in FIGS. 7 and 8, which will not be repeated here.

In the above implementation, the heater 60 is provided to heat the adhesive layer 30 when peeling off the original substrate 10, so that the light emitting diode 20 adheres to the adhesive layer more tightly, so that when the light emitting diode 20 is separated from the original substrate 10, the light emitting diode 20 will not be displaced.

Figure 10:
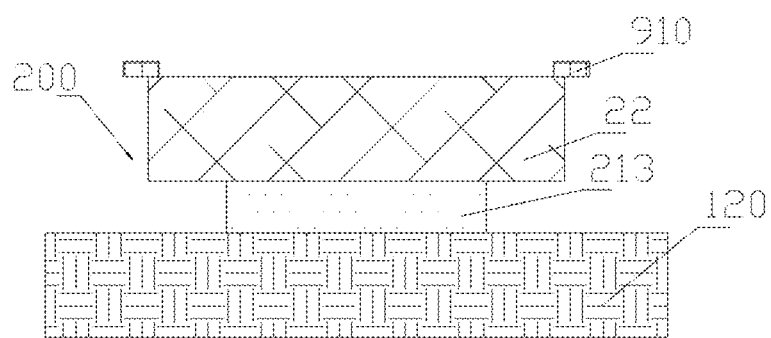
FIG. 10 is a schematic diagram of a display backplate according to implementations of the present disclosure.

Now reference is made to FIG. 10, which is a schematic diagram of a display backplate 120 according to implementations of the present disclosure. The display backplate 120 is provided with a plurality of light emitting diodes 200. The plurality of light emitting diodes 200 are transferred by the mass transfer device provided in the above implementations to the display backplate 120. In a process of transferring the light emitting diode 200 from the mass transfer device to the display backplate 120, the supporting structure 90 is broken, and only the ends 910 of the at least two supporting structures 90 are retained on the light emitting diode 200.

Figure 11:
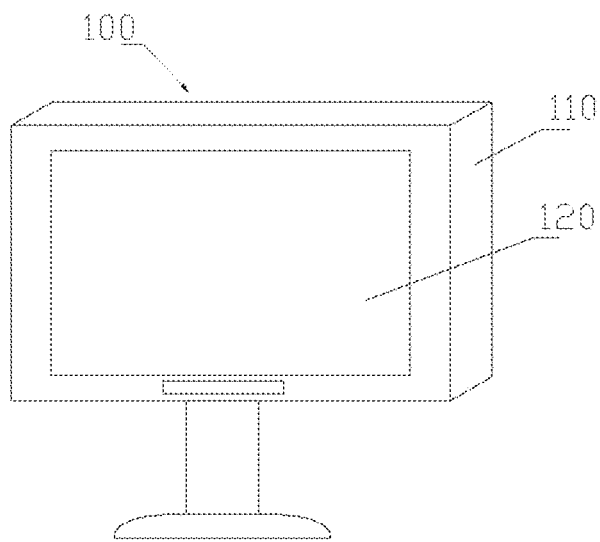
FIG. 11 is a schematic diagram of a display apparatus according to implementations of the present disclosure.

Now reference is made to FIG. 11, which is a schematic diagram of a display apparatus 100 according to implementations of the present disclosure. The display device 100 may be a product with a display function, such as a notebook computer, a tablet computer, a display, a television, a mobile phone, and the like. The display device 100 includes a housing 110 and a display backplate 120 received in the housing.

Obviously, various modifications and variations can be made by those skilled in the art without departing from the spirit and scope of the disclosure. In this way, in a case where these modifications and variations of the present disclosure fall within the scope of the claims and their equivalents, the present disclosure is also intended to encompass these modifications and variations.

The above examples are only the preferred implementations of the present disclosure, which of course cannot be constructed to limit the scope of the present disclosure. Therefore the equivalent changes made in view of the claims of the present disclosure still belong to the scope covered by the present disclosure.

What is claimed is:

1. A mass transfer device, comprising:
a transfer substrate configured to be provided with at least one light emitting diode arranged on the transfer substrate at intervals; and
a supporting structure arranged on the transfer substrate and supporting the at least one light emitting diode, wherein the supporting structure comprises at least two supporting columns extending from the transfer substrate, and an end of each of the at least two supporting columns away from the transfer substrate is connected with the light emitting diode; and the light emitting diode is separated from the transfer substrate,
wherein the light emitting diode comprises a first end face facing the transfer substrate, a second end face opposite to the first end face, and a side face located between the first end face and the second end face, wherein the end of the each of the at least two supporting columns away from the transfer substrate is fixed to the side face.

2. The mass transfer device of claim 1, wherein the light emitting diode comprises a semiconductor functional layer, and a first electrode and a second electrode respectively coupled with the semiconductor functional layer, wherein the first electrode and the second electrode are both located on a side of the semiconductor functional layer proximate to the transfer substrate.

3. The mass transfer device of claim 2, wherein the light emitting diode comprises a semiconductor functional layer and a third electrode coupled with the semiconductor functional layer, wherein the third electrode is arranged on a side of the semiconductor functional layer proximate to the transfer substrate.

4. The mass transfer device of claim 1, wherein the supporting column is made from at least one of silicon, silicon dioxide, or aluminum nitride.

5. A method for manufacturing a mass transfer device, comprising:
providing a transfer substrate coated with an adhesive layer;
adhering, with the adhesive layer, at least one light emitting diode arranged on an original substrate at intervals to transfer the light emitting diode from the original substrate to the transfer substrate;
forming a supporting structure, wherein the supporting structure comprises at least two supporting columns extending from the transfer substrate, and an end of each of the at least two supporting columns away from the transfer substrate is connected with the light emitting diode; and
removing the adhesive layer, so that the light emitting diode is fixed, through the supporting structure, to the transfer substrate at a predetermined distance from the transfer substrate.

6. The method of claim 5, wherein the adhering, with the adhesive layer, the light emitting diode arranged on the original substrate at intervals comprises:
covering the original substrate with the transfer substrate and adhesively picking the light emitting diode with the adhesive layer; and
peeling off the original substrate.

7. The method of claim 6, wherein adhesively picking the light emitting diode with the adhesive layer comprises:
adhering, with the adhesive layer, a first electrode and a second electrode of the light emitting diode to transfer the light emitting diode to the transfer substrate, wherein the light emitting diode comprises a semiconductor functional layer, and the first electrode and the second electrode are respectively coupled with the semiconductor functional layer and are both located at a side of the semiconductor functional layer proximate to the transfer substrate.

8. The method of claim 6, wherein adhesively picking the light emitting diode with the adhesive layer comprises:
adhering, with the adhesive layer, a third electrode of the light emitting diodes to transfer the light emitting diode to the transfer substrate, wherein the light emitting diode comprises a semiconductor functional layer, and the third electrode is coupled with the semiconductor functional layer and is located at a side of the semiconductor functional layer proximate to the transfer substrate.

9. The method of claim 6, wherein peeling off the original substrate comprises:
heating the adhesive layer with a heater to increase temperature of the adhesive layer so as to increase an adhesion of the adhesive layer.

10. The method of claim 5, wherein connecting the each of the at least two supporting columns to the light emitting diode with the end away from the transfer substrate comprises:
fixing the end of the each of the at least two supporting column away from the transfer substrate to a second end face of the light emitting diode, with the at least two supporting columns and a side face of the light emitting diode spaced apart with a gap therebetween, wherein the second end face is opposite to a first end face of the light emitting diode, the first end face faces the transfer substrate, and the side face is located between the first end face and the second end face.

11. The method of claim 5, wherein connecting the each of the at least two supporting columns to the light emitting diode with the end away from the transfer substrate comprises:
fixing the end of the each of the at least two supporting column away from the transfer substrate to a side face of the light emitting diode, wherein the side surface is located between a first end face and a second end face of the light emitting diode, the first end face faces the transfer substrate, and the second end face is opposite to the first end face.

12. The method of claim 5, wherein the adhesive layer is a made from cold decomposition adhesive, and the cold decomposition has an adhesion increasing with increase in temperature.

* * * * *